United States Patent
Jourba et al.

(10) Patent No.: US 10,797,142 B2
(45) Date of Patent: Oct. 6, 2020

(54) FINFET-BASED SPLIT GATE NON-VOLATILE FLASH MEMORY WITH EXTENDED SOURCE LINE FINFET, AND METHOD OF FABRICATION

(71) Applicant: Silicon Storage Technology, Inc., San Jose, CA (US)

(72) Inventors: Serguei Jourba, Aix en Provence (FR); Catherine Decobert, Pourrieres (FR); Feng Zhou, Fremont, CA (US); Jinho Kim, Saratoga, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 3 days.

(21) Appl. No.: 16/208,288

(22) Filed: Dec. 3, 2018

(65) Prior Publication Data
US 2020/0176578 A1 Jun. 4, 2020

(51) Int. Cl.
*H01L 29/423* (2006.01)
*H01L 27/11521* (2017.01)
(Continued)

(52) U.S. Cl.
CPC .... *H01L 29/42328* (2013.01); *G11C 16/0408* (2013.01); *G11C 16/10* (2013.01);
(Continued)

(58) Field of Classification Search
CPC .......... H01L 29/42328; H01L 29/0847; H01L 29/1037; H01L 29/66795; H01L 29/99825;
(Continued)

(56) References Cited

U.S. PATENT DOCUMENTS 5,029,130 A 7/1991 Yeh
6,747,310 B2 6/2004 Fan
(Continued)

FOREIGN PATENT DOCUMENTS

WO 2017 011139 1/2019

OTHER PUBLICATIONS

U.S. Appl. No. 15/957,615, filed Apr. 19, 2018 entitled "Split Gate Non-volatile Memory Cells and Logic Devices With FINFET Structure, and Method of Making Same"—Applicant—Silicon Storage Technology, Inc.
(Continued)

*Primary Examiner* — Mark W Tornow
(74) *Attorney, Agent, or Firm* — DLA Piper LLP (US)

(57) ABSTRACT

A memory cell is formed on a semiconductor substrate having an upper surface with a plurality of upwardly extending fins. First and second fins extend in one direction, and a third fin extends in an orthogonal direction. Spaced apart source and drain regions are formed in each of the first and second fins, defining a channel region extending there between in each of the first and second fins. The source regions are disposed at intersections between the third fin and the first and second fins. A floating gate is disposed laterally between the first and second fins, and laterally adjacent to the third fin, and extends along first portions of the channel regions. A word line gate extends along second portions of the channel regions. A control gate is disposed over the floating gate. An erase gate is disposed over the source regions and the floating gate.

13 Claims, 17 Drawing Sheets

(51) Int. Cl.
  *H01L 29/08* (2006.01)
  *H01L 29/10* (2006.01)
  *H01L 29/66* (2006.01)
  *H01L 29/78* (2006.01)
  *H01L 29/788* (2006.01)
  *H01L 21/027* (2006.01)
  *H01L 21/308* (2006.01)
  *H01L 21/3105* (2006.01)
  *G11C 16/04* (2006.01)
  *G11C 16/10* (2006.01)
  *G11C 16/14* (2006.01)
  *G11C 16/26* (2006.01)

(52) U.S. Cl.
  CPC .............. *G11C 16/14* (2013.01); *G11C 16/26* (2013.01); *H01L 27/11521* (2013.01); *H01L 29/0847* (2013.01); *H01L 29/1037* (2013.01); *H01L 29/66795* (2013.01); *H01L 29/66825* (2013.01); *H01L 29/7851* (2013.01); *H01L 29/7883* (2013.01); *H01L 21/0271* (2013.01); *H01L 21/3081* (2013.01); *H01L 21/3086* (2013.01); *H01L 21/31053* (2013.01); *H01L 29/6653* (2013.01)

(58) Field of Classification Search
  CPC .............. H01L 29/7851; H01L 29/7883; H01L 27/11521; G11C 16/0408; G11C 16/10; G11C 16/14; G11C 16/26
  See application file for complete search history.

(56) References Cited

U.S. PATENT DOCUMENTS

| | | | |
|---|---|---|---|
| 7,315,056 B2 | 1/2008 | Klinger | |
| 7,329,580 B2 | 2/2008 | Choi | |
| 7,410,913 B2 | 8/2008 | Lee | |
| 7,423,310 B2 | 9/2008 | Verhoeven | |
| 7,868,375 B2 | 1/2011 | Liu | |
| 7,927,994 B1 | 4/2011 | Liu | |
| 8,068,370 B2 | 11/2011 | Lue | |
| 8,148,768 B2 | 4/2012 | Do | |
| 8,420,476 B2 | 4/2013 | Booth | |
| 8,461,640 B2 | 6/2013 | Hu | |
| 8,710,485 B2 | 4/2014 | Saitoh | |
| 8,941,153 B2 | 1/2015 | Lee | |
| 9,276,005 B1 | 3/2016 | Zhou | |
| 9,276,006 B1 | 3/2016 | Chen | |
| 9,406,689 B2 | 8/2016 | Li | |
| 9,614,048 B2 | 4/2017 | Wu | |
| 9,634,018 B2 | 4/2017 | Su | |
| 9,972,630 B2 | 5/2018 | Su et al. | |
| 9,985,042 B2 | 5/2018 | Su et al. | |
| 10,269,437 B2* | 4/2019 | Lin | G11C 16/0441 |
| 2005/0012137 A1 | 1/2005 | Levi | |
| 2005/0266638 A1 | 12/2005 | Cho et al. | |
| 2005/0280000 A1 | 12/2005 | Ishii | |
| 2006/0097310 A1 | 5/2006 | Kim | |
| 2006/0208307 A1 | 9/2006 | Chang | |
| 2007/0090443 A1* | 4/2007 | Choi | H01L 27/1203 257/314 |
| 2007/0158730 A1 | 7/2007 | Burnett | |
| 2008/0173921 A1 | 7/2008 | Li | |
| 2010/0320525 A1 | 12/2010 | Nagashima | |
| 2013/0270627 A1 | 10/2013 | Cheng | |
| 2015/0035039 A1* | 2/2015 | Li | H01L 29/785 257/316 |
| 2016/0064398 A1* | 3/2016 | Toh | H01L 29/66825 257/316 |
| 2016/0218110 A1 | 7/2016 | Yang | |
| 2016/0379987 A1* | 12/2016 | Liu | H01L 29/7851 257/316 |
| 2017/0117285 A1 | 4/2017 | Chen | |
| 2017/0125429 A1 | 5/2017 | Su et al. | |
| 2017/0243955 A1 | 8/2017 | Shinohara | |
| 2017/0271484 A1 | 9/2017 | Baars et al. | |
| 2017/0301683 A1 | 10/2017 | Chen | |
| 2017/0330949 A1 | 11/2017 | Wang | |
| 2017/0345840 A1 | 11/2017 | Su et al. | |
| 2017/0345941 A1* | 11/2017 | Wu | H01L 27/11524 |
| 2018/0012898 A1 | 1/2018 | Wu et al. | |

OTHER PUBLICATIONS

U.S. Appl. No. 15/933,124, filed Mar. 22, 2018 entitled "Two Transistor Finfet-Based Split Gate Non-volatile Floating Gate Flash Memory and Method of Fabrication"—Applicant—Silicon Storage Technology, Inc.

U.S. Appl. No. 16/028,244, filed Jul. 5, 2018 entitled "Split Gate Non-Volatile Memory Cells With Three-Dimensional FINFET Structure, and Method of Making Same"—Applicant—Silicon Storage Technology, Inc.

U.S. Appl. No. 16/422,740, filed May 24, 2019 entitled "Method of Making Split Gate Non-Volatile Memory Cells With Three-Dimensional FINFET Structure, and Method of Making Same," Jourba et al.

U.S. Appl. No. 16/208,150, filed Dec. 3, 2018 entitled "Split Gate Non-volatile Memory Cells With FINFET Structure and HKMG Memory and Logic Gates, and Method of Making Same," Zhou, et al.

\* cited by examiner

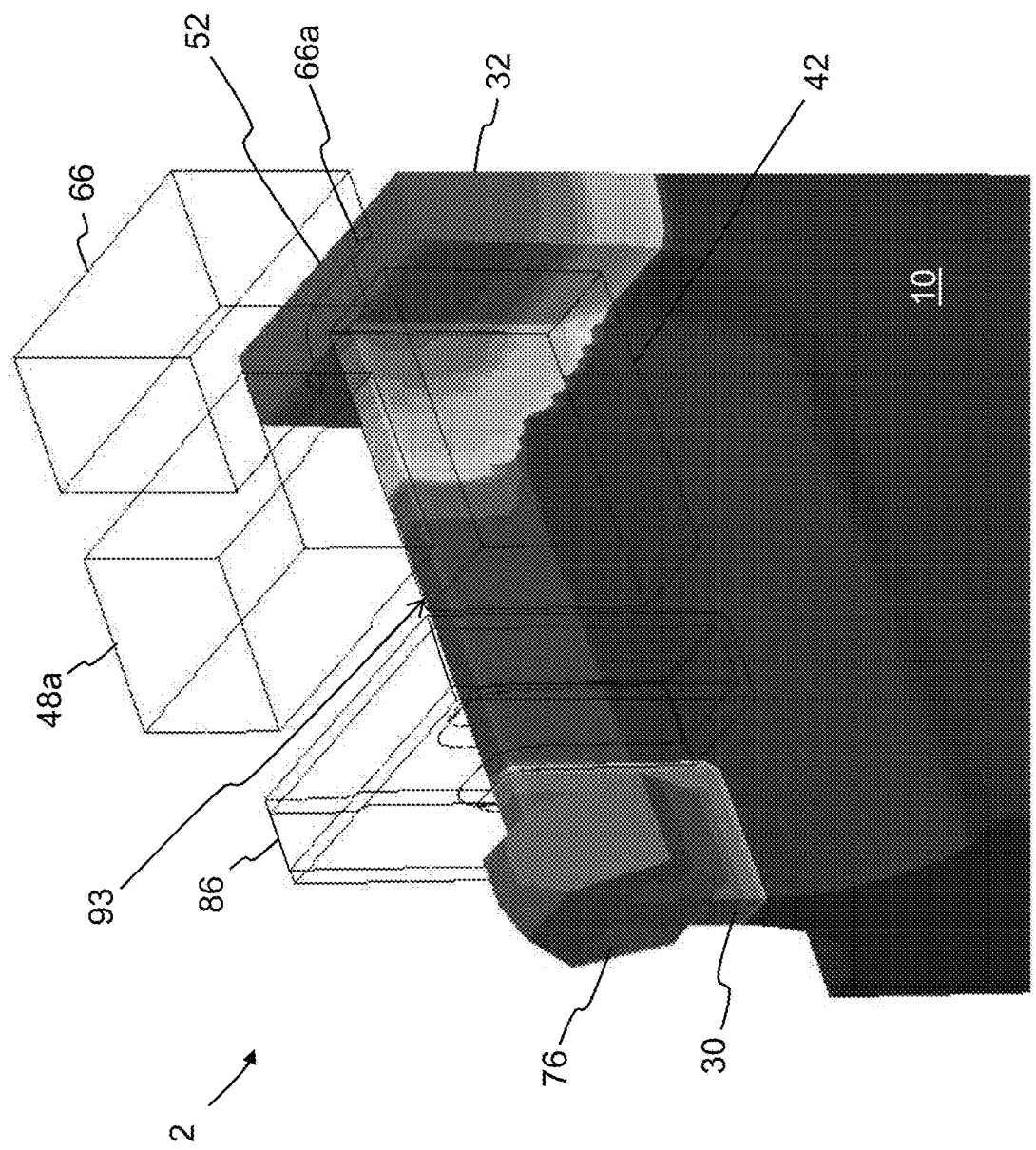

US 10,797,142 B2

FINFET-BASED SPLIT GATE NON-VOLATILE FLASH MEMORY WITH EXTENDED SOURCE LINE FINFET, AND METHOD OF FABRICATION

FIELD OF THE INVENTION

The present invention relates to non-volatile flash memory cell arrays.

BACKGROUND OF THE INVENTION

Non-volatile memory devices are well known in the art. For example, a split-gate memory cell is disclosed in U.S. Pat. No. 5,029,130 (which is incorporated herein by reference for all purposes). This memory cell has a floating gate and a control gate disposed over and controlling the conductivity of a channel region of the substrate extending between source and drain regions. Various combinations of voltages are applied to the control gate, source and drain to program the memory cell (by injecting electrons onto the floating gate), to erase the memory cell (by removing electrons from the floating gate), and to read the memory cell (by measuring or detecting the conductivity of the channel region under the floating gate to determine the programming state of the floating gate).

The configuration and number of gates in non-volatile memory cells can vary. For example, U.S. Pat. No. 7,315,056 (which is incorporated herein by reference for all purposes) discloses a memory cell that additionally includes a program/erase gate over the source region. U.S. Pat. No. 7,868,375 (which is incorporated herein by reference for all purposes) discloses a memory cell that additionally includes an erase gate over the source region and a coupling gate over the floating gate. See also U.S. Pat. Nos. 6,747,310, 7,868,375, 9,276,005 and 9,276,006 (which are also incorporated herein by reference for all purposes).

Because the problem of shrinking the lithography size thereby reducing the channel width affects all semiconductor devices, a Fin-FET type of structure has been proposed. In a Fin-FET type of structure, a fin shaped member of the semiconductor substrate material connects the source region to the drain region. The fin shaped member has a top surface and two opposing side surfaces. Current from the source to the drain regions can then flow along the top surface as well as the two side surfaces. Thus, the surface width of the channel region is increased, thereby increasing the current flow, without sacrificing more semiconductor real estate, by "folding" the channel region into two side surfaces, thereby reducing the "footprint" of the channel region. Non-volatile memory cells using such Fin-FETs have been disclosed. Some examples of prior art Fin-FET non-volatile memory structures include U.S. Pat. Nos. 7,423,310, 7,410,913, 8,461,640, and 9,634,018 (which are also incorporated herein by reference for all purposes). However, these prior art Fin-FET structures have disclosed using the floating gate as a stack gate device, or using trapping material, or using SRO (silicon rich oxide) or using nanocrystal silicon to store charges, or other memory cell configurations that are either too simplistic for memory cells having more than 2 gates or too complex for the number of gates at issue.

A number of problems have been discovered by the inventors when scaling memory cells down in size. Ultra-thin polysilicon or amorphous silicon film deposition and doping techniques are complex and often suffer from insufficient and non-uniform doping combined with structural non-uniformities. Ballistic electron transport in ultra-thin polysilicon floating gates leads to programming issues (difficulties to capture the hot electrons in ultra-thin floating gates). Integration of the control gate on top of the floating gate results in a thick poly stack posing serious process integration challenges for advanced CMOS technologies (CMP planarization steps and following advanced lithography steps used in high K metal gate process flows). Capacitive coupling between neighboring floating gates is drastically increased with horizontal scaling. This results in strong cross-talk effects (i.e. the read current of the cell becomes dependent on the charge state of the neighbor cells) and requires complex management by design. The scaling of the planar floating gate memory cells is limited by reduction of the read currents related to transistors width scaling. Lower read currents penalize the access times and require complex design techniques to meet high speed access time specifications. Planar floating gate architecture doesn't allow for efficient control of the sub-threshold leakage of the floating gate and select transistors at advanced technology nodes, resulting in high background leakage from the unselected cells sharing the same bit line with selected cell.

BRIEF SUMMARY OF THE INVENTION

The aforementioned issues are addressed by a memory device that includes a semiconductor substrate having an upper surface with a plurality of upwardly extending fins and a memory cell. Each of the fins includes first and second side surfaces that oppose each other and that terminate in a top surface. A first fin of the plurality of fins has a length that extends in a first direction. A second fin of the plurality of fins has a length that extends in the first direction. A third fin of the plurality of fins has a length that extends in a second direction that is perpendicular to the first direction. The memory cell includes spaced apart first source and first drain regions in the first fin, with a first channel region of the first fin extending along the top surface and the opposing side surfaces of the first fin between the first source and first drain regions, wherein the first source region is disposed at an intersection of the first and third fins, spaced apart second source and second drain regions in the second fin, with a second channel region of the second fin extending along the top surface and the opposing side surfaces of the second fin between the second source and second drain regions, wherein the second source region is disposed at an intersection of the second and third fins, a floating gate disposed laterally between and insulated from the first and second fins, and is disposed laterally adjacent to and insulated from the third fin, wherein the floating gate extends along and is insulated from a first portion of the first channel region and a first portion of the second channel region, a word line gate that extends along and is insulated from a second portion of the first channel region and a second portion of the second channel region, a control gate that is disposed over and insulated from the floating gate, and an erase gate that includes a first portion disposed over and insulated from the first and second source regions and a second portion that is disposed over and insulated from the floating gate.

Additionally, a memory device includes a semiconductor substrate having an upper surface with a plurality of upwardly extending fins and a plurality of memory cells arranged in rows and columns on the substrate. Each of the fins includes first and second side surfaces that oppose each other and that terminate in a top surface. First fins of the plurality of fins each has a length that extends in a column direction. Second fins of the plurality of fins each has a length that extends in a row direction that is perpendicular to the column direction. Each of the memory cells includes spaced apart first source and first drain regions in one of the first fins, with a first channel region of the one first fin extending along the top surface and the opposing side surfaces of the one first fin between the first source and first drain regions, wherein the first source region is disposed at an intersection of the one first fin and one of the second fins, spaced apart second source and second drain regions in another one of the first fins, with a second channel region of the another one first fin extending along the top surface and the opposing side surfaces of the another one first fin between the second source and second drain regions, wherein the second source region is disposed at an intersection of the another one first fin and the one second fin, a floating gate disposed laterally between and insulated from the one first fin and the another one first fin, and is disposed laterally adjacent to and insulated from the one second fin, wherein the floating gate extends along and is insulated from a first portion of the first channel region and a first portion of the second channel region, a word line gate that extends along and is insulated from a second portion of the first channel region and a second portion of the second channel region, a control gate that is disposed over and insulated from the floating gate, and an erase gate that includes a first portion disposed over and insulated from the first and second source regions and a second portion that is disposed over and insulated from the floating gate.

A method of forming a memory device includes forming a plurality of upwardly extending fins in an upper surface of a semiconductor substrate, and forming a memory cell. Each of the fins includes first and second side surfaces that oppose each other and that terminate in a top surface. A first fin of the plurality of fins has a length that extends in a first direction. A second fin of the plurality of fins has a length that extends in the first direction. A third fin of the plurality of fins has a length that extends in a second direction that is perpendicular to the first direction. The forming of the memory cell includes forming spaced apart first source and first drain regions in the first fin, with a first channel region of the first fin extending along the top surface and the opposing side surfaces of the first fin between the first source and first drain regions, wherein the first source region is disposed at an intersection of the first and third fins, forming spaced apart second source and second drain regions in the second fin, with a second channel region of the second fin extending along the top surface and the opposing side surfaces of the second fin between the second source and second drain regions, wherein the second source region is disposed at an intersection of the second and third fins, forming a floating gate laterally between and insulated from the first and second fins, and laterally adjacent to and insulated from the third fin, wherein the floating gate extends along and is insulated from a first portion of the first channel region and a first portion of the second channel region, forming a word line gate that extends along and is insulated from a second portion of the first channel region and a second portion of the second channel region, forming a control gate over and insulated from the floating gate, and forming an erase gate that includes a first portion disposed over and insulated from the first and second source regions and a second portion that is disposed over and insulated from the floating gate.

A method of forming a memory device includes forming a plurality of upwardly extending fins in an upper surface of a semiconductor substrate, and forming a plurality of memory cells arranged in rows and columns on the substrate. Each of the fins including first and second side surfaces that oppose each other and that terminate in a top surface. First fins of the plurality of fins each has a length that extends in a column direction. Second fins of the plurality of fins each has a length that extends in a row direction that is perpendicular to the column direction. Each of the memory cells is formed by forming spaced apart first source and first drain regions in one of the first fins, with a first channel region of the one first fin extending along the top surface and the opposing side surfaces of the one first fin between the first source and first drain regions, wherein the first source region is disposed at an intersection of the one first fin and one of the second fins, forming spaced apart second source and second drain regions in another one of the first fins, with a second channel region of the another one first fin extending along the top surface and the opposing side surfaces of the another one first fin between the second source and second drain regions, wherein the second source region is disposed at an intersection of the another one first fin and the one second fin, forming a floating gate laterally between and insulated from the one first fin and the another one first fin, and laterally adjacent to and insulated from the one second fin, wherein the floating gate extends along and is insulated from a first portion of the first channel region and a first portion of the second channel region, forming a word line gate that extends along and is insulated from a second portion of the first channel region and a second portion of the second channel region, forming a control gate over and insulated from the floating gate, and forming an erase gate that includes a first portion disposed over and insulated from the first and second source regions and a second portion that is disposed over and insulated from the floating gate.

Other objects and features of the present invention will become apparent by a review of the specification, claims and appended figures.

BRIEF DESCRIPTION OF THE DRAWINGS

FIG. 2 is a partial perspective view of the split-gate non-volatile memory cell of the present invention.

DETAILED DESCRIPTION OF THE INVENTION

Figure 1A:
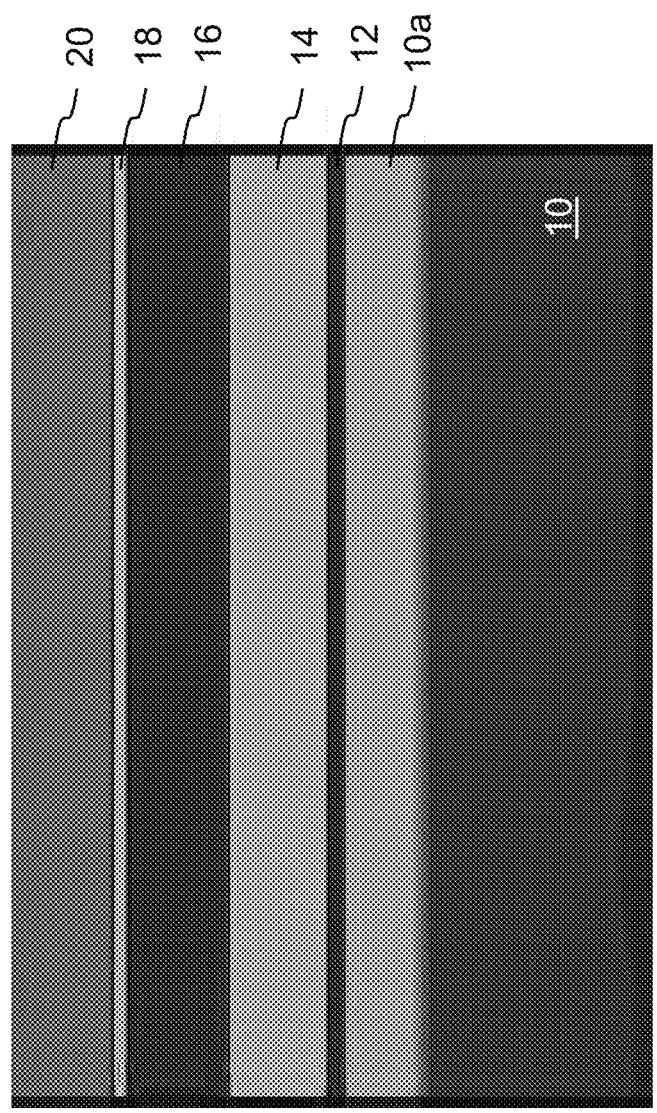
FIGS. 1A-1C are side cross sectional views showing the steps in forming the split-gate non-volatile memory cell of the present invention.
Figure 1C:
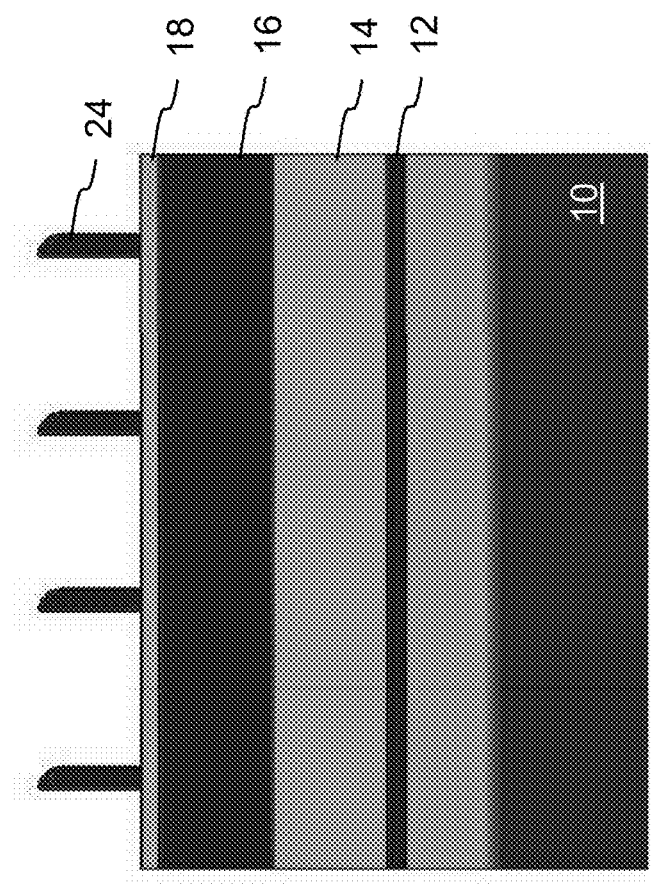
Figure 1B:
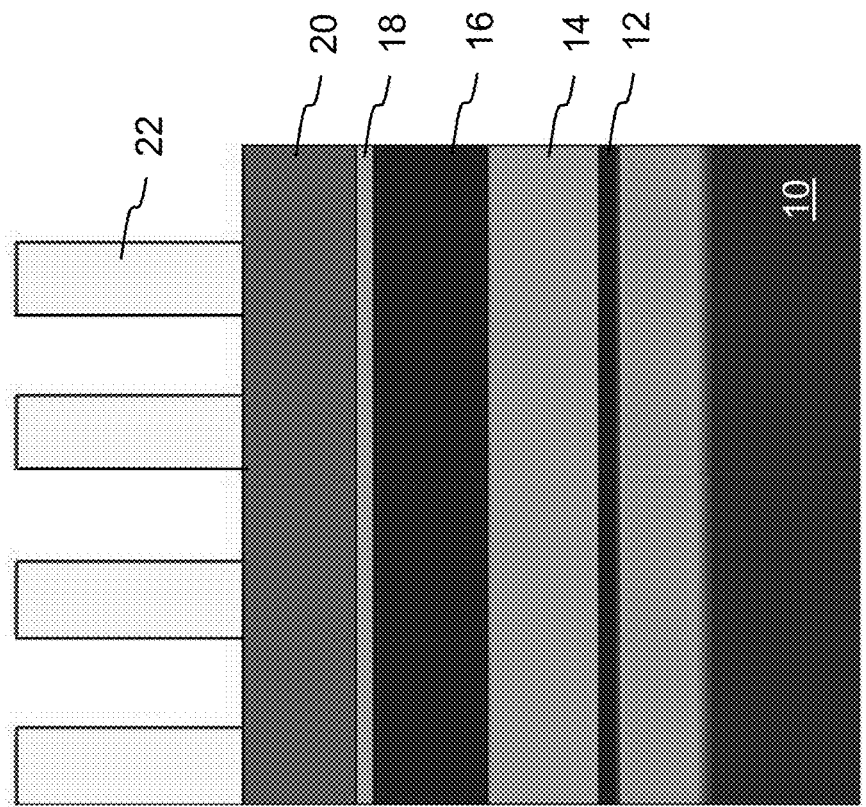
Figure 1E:
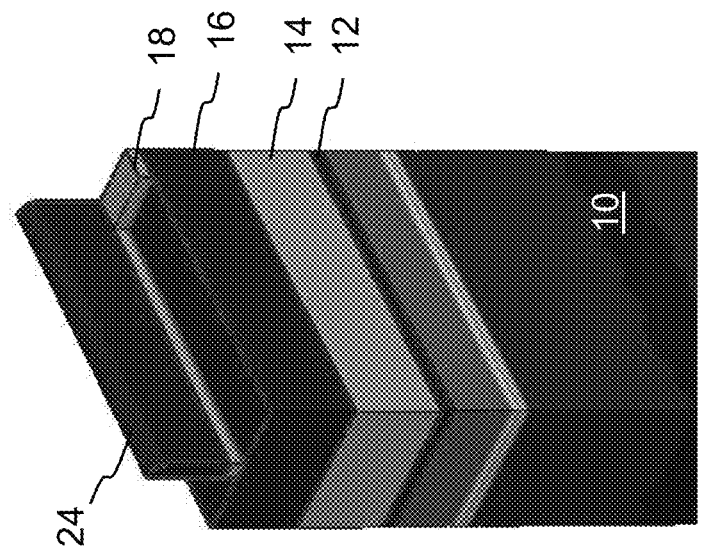
FIGS. 1D-1X are perspective cross sectional views showing the steps in forming the split-gate non-volatile memory cell of the present invention.

The present invention is a memory cell design (and method of making) that can be scaled down in size, so that the number of memory cells that can be formed in any given unit area of a substrate can be increased without sacrificing performance. The formation of the memory cell is shown in FIGS. 1A to 1X. After forming an appropriate p-type doping profile 10a in semiconductor substrate 10, the process continues with growth of a silicon dioxide (oxide) layer 12 on the surface of substrate 10. A silicon nitride (nitride) layer 14 is formed on oxide layer 12. Another oxide layer 16 is formed on the nitride layer 14, and another nitride layer 18 is formed on the oxide layer 16. A hard mask material 20 is formed on the nitride layer 18. These layers are shown in FIG. 1A.

Photoresist 22 is formed on the hard mask material 20. The photoresist 22 is then patterned with a masking step, which includes a photolithography process that selectively exposes portions of the photoresist, and selectively removes portions of the photoresist to expose selective portions of the underlying material (i.e., strips of the underlying hard mask material 20 in this case). The resulting structure is shown in FIG. 1B.

An etch is performed to remove the exposed portions of hard mask material 20, leaving strips of hard mask material. After photoresist removal, oxide spacers 24 are formed along the sides of the hard mask material strips 20 by performing an oxide deposition followed by anisotropic oxide etch, which leaves spacers 24 on vertical sidewalls of hard mask strips 20. Photoresist is formed over the structure and patterned to leave strips of photoresist covering alternating spacers 24 (e.g., the right hand spacer along each strip 20). An oxide etch is then used to remove those oxide spacers 24 left exposed by the photoresist. After photoresist removal, an etch is performed to remove hard mask strips 20. The resulting structure is shown in FIG. 1C.

Figure 1D:
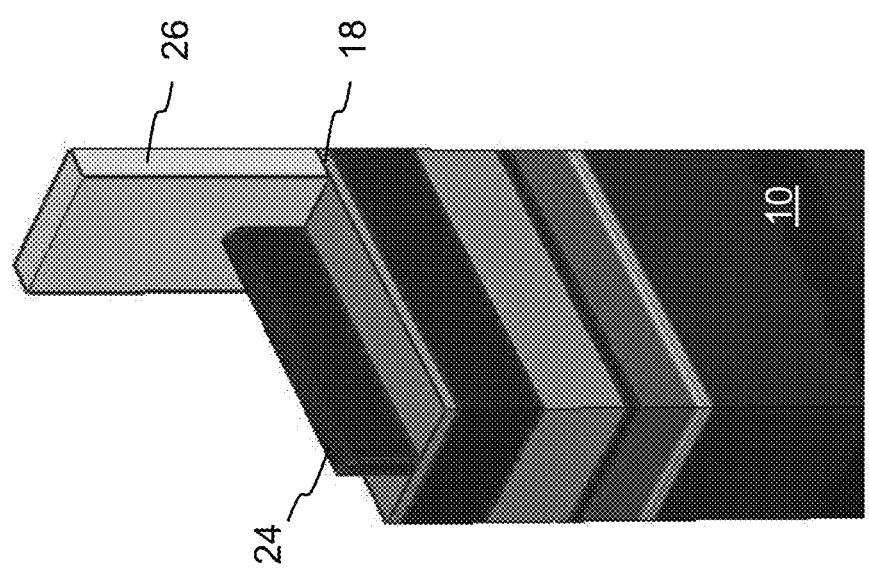

Photoresist 26 is formed on the structure and patterned leaving strips of the photoresist 26 each having a length extending orthogonally to the length direction of oxide spacers 24, as shown in FIG. 1D. A nitride etch is then performed to remove exposed portions of nitride layer 18 (leaving behind those portions thereof protected by oxide spacers 24 and photoresist strips 26, as shown in FIG. 1E (after photoresist 26 is removed). A series of etches are then performed. Specifically, an oxide etch is used to remove spacers 24 and exposed portions of oxide 16, exposing portions of nitride layer 14. A nitride etch is used to remove the remaining portions of nitride 18, and remove exposed portions of nitride layer 14, exposing portions of oxide layer 12. An oxide etch is used to remove the exposed portions of oxide layer 12, exposing portions of substrate 10. A silicon etch is then used to etch pairs of trenches 28/29 into the exposed portions of substrate 10, with a thin fin 30 of substrate 10 between adjacent pairs of trenches 28/29. Fins 30 extend lengthwise in the vertical/column direction and are parallel to each other. The trenches 28/29 are periodically interrupted by thin fin structures 32 of substrate 10 that extend lengthwise in the horizontal/row direction, such that vertically extending fins 30 periodically intersect the horizontally extending fins 32. The resulting structure is shown in 1F. While only one fin 30 and one fin 32 are shown in the figures, it should be appreciated that there is a grid of intersecting fins 30 and 32, with fins 30 extending lengthwise in the column direction and fins 32 extending lengthwise in the row direction. Each fin 30/32 includes two sidewalls that oppose each other and terminate in a top surface (on which oxide 12 is disposed).

Figure 1G:
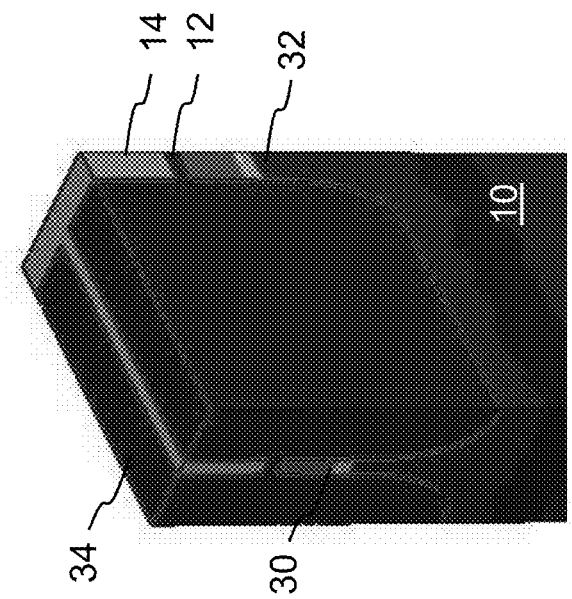
Figure 1F:
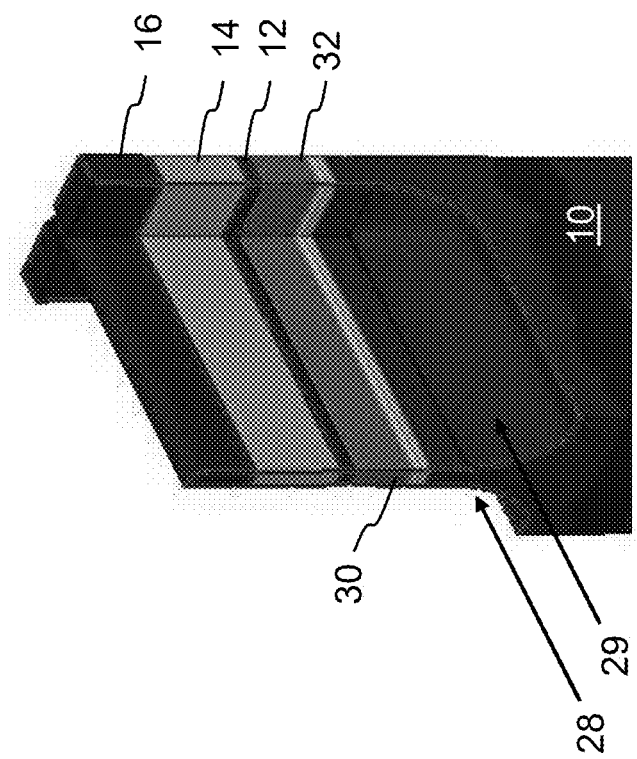
Figure 1I:
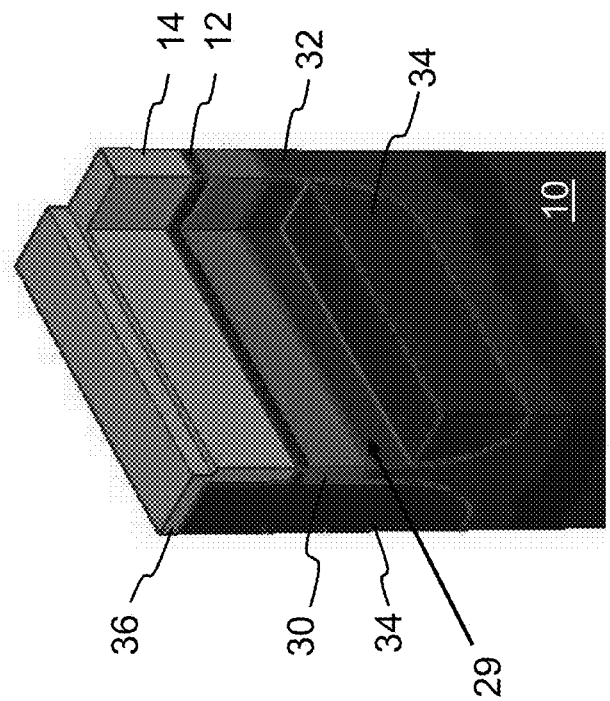
Figure 1H:
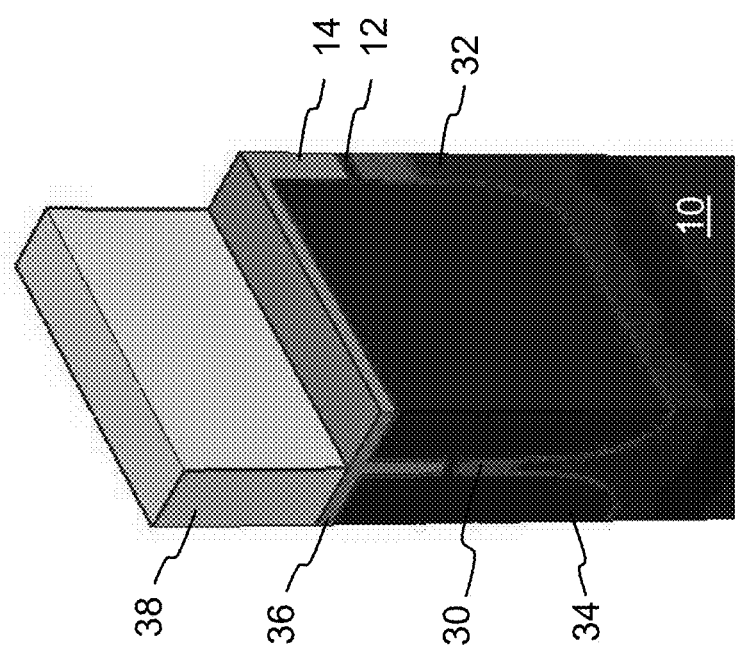

Implantation can be performed at this time to the exposed substrate (e.g., CMOS baseline and bottom fin isolation). Insulation material 34 (e.g., oxide) is formed over the structure (including filling trenches 28/29 with oxide 34), followed by oxide planarization to remove the oxide above the tops of nitride 14, as shown in FIG. 1G. A hard mask insulation layer (e.g., nitride) 36 is formed on the structure, followed by a masking step to form photoresist 38 extending over just one side of the fin 30 (i.e., over filled trench 28 but not over filled trench 29), as shown in FIG. 1H. A nitride etch is used to remove the exposed portions of nitride 36, followed by an oxide etch that removes the upper portion of oxide 34 on one side of fin 32 (i.e., in trench 29), as shown in FIG. 1I (after photoresist 38 is removed). A cell implant can be performed at this time.

Figure 1K:
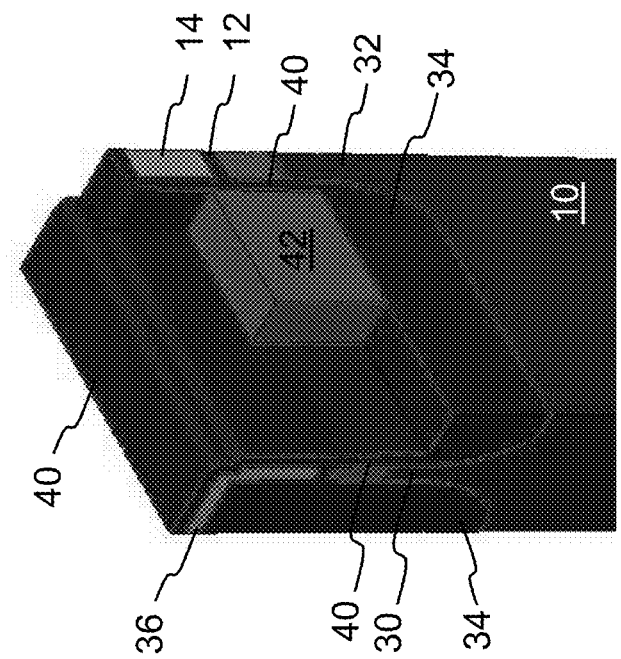
Figure 1J:
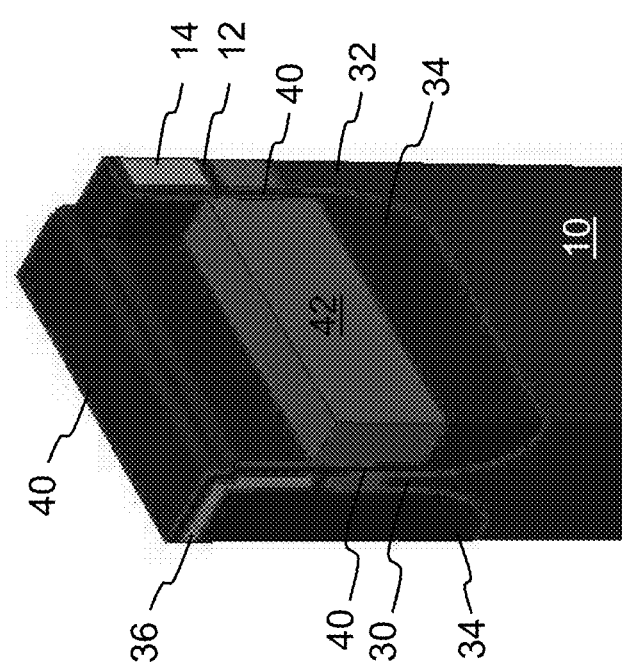
Figure 1M:
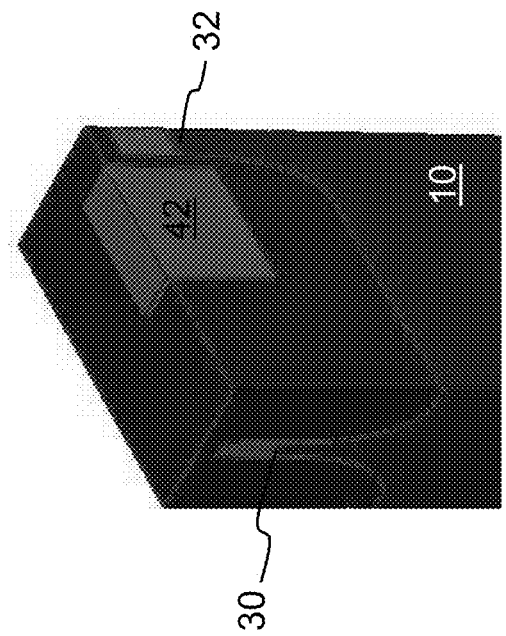
Figure 1L:
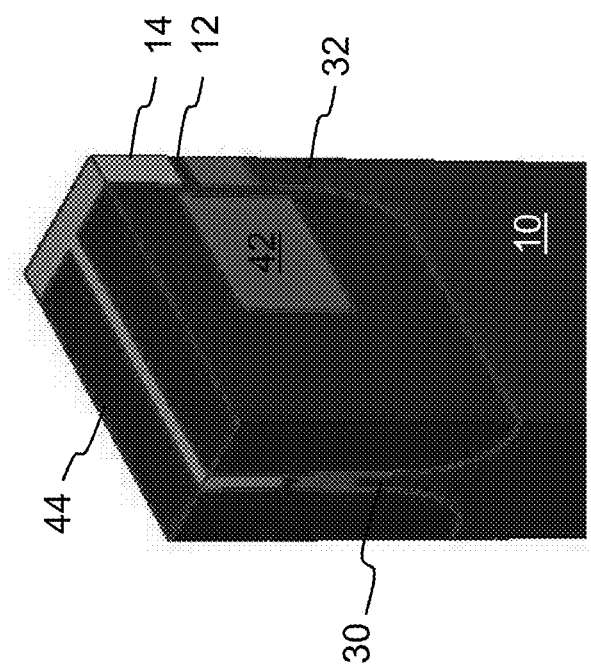

An oxide layer 40 is formed over the structure, including along the exposed sidewalls of fins 30 and 32 in trench 29. A polysilicon deposition, doping, anneal, and etch back are performed to form a block of polysilicon (poly) 42 in trench 29 (on one side of fin 30 and one side of fin 32, where the two fins intersect), as shown in FIG. 1J. Poly block 42 is laterally adjacent to both fin 30 and fin 32 and insulated therefrom by oxide layer 40. Photoresist is formed over a portion of the poly block 42 that is closest to where fins 30 and 32 intersect, and a poly etch is used to remove the other portion of poly block 42 (i.e., so that poly block 42 extends only partially along the length of trench 29 that is immediately adjacent intersection of fins 30/32), as shown in FIG. 1K (after photoresist removal). Oxide 44 is deposited on the structure, which is followed by CMP (chemical mechanical polish) planarization, as shown in FIG. 1L. A nitride etch is used to remove nitride 14. An oxide deposition (to fill the void left by removed nitride 14) and CMP planarization (using poly block 42 as the polish stop) is used to laterally surround poly block 42 with oxide, as shown in FIG. 1M.

Figure 1O:
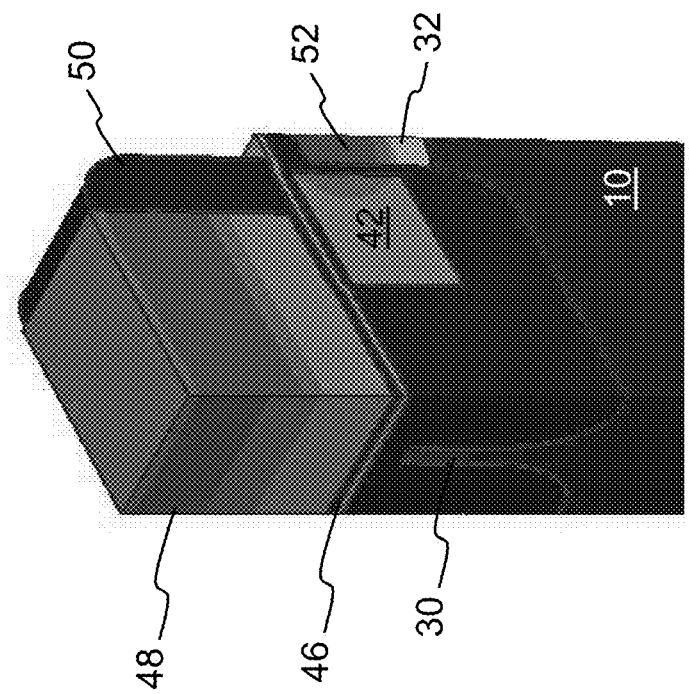
Figure 1N:
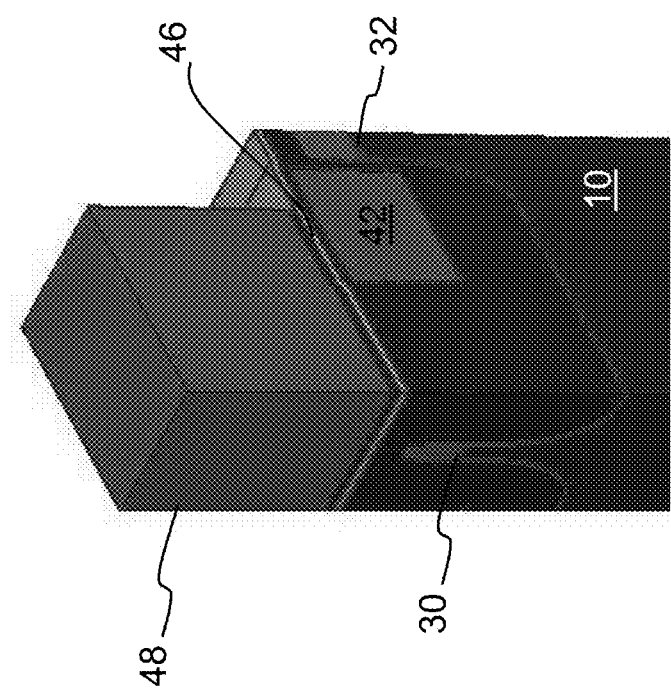

An insulation layer 46 (preferably ONO, which includes oxide-nitride-oxide sublayers) is formed over the structure. A polysilicon layer 48 is formed on ONO layer 46. A masking step is used to cover the poly layer 48 with photoresist except for a strip extending over the fin 32. A poly etch is then used to remove the portion of poly layer 48 over fin 32, as shown in FIG. 1N (after photoresist removal). An oxide spacer 50 is formed along the side of poly layer 48 and extending along fin 32 by oxide deposition and etch, using the nitride of layer 46 as etch stop. Spacer 50 protects fin 30, but does not cover fin 32. An implantation and anneal are then performed to form a source region 52 in fin 32, as shown in FIG. 1O.

Figure 1Q:
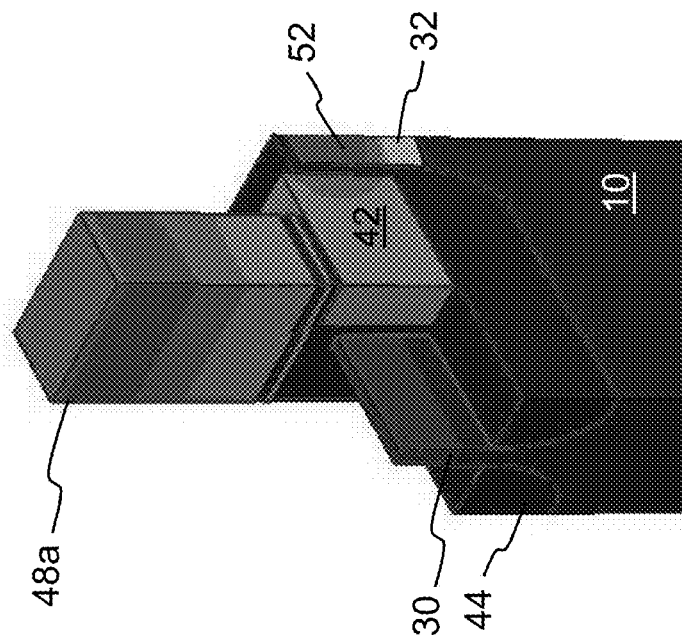
Figure 1P:
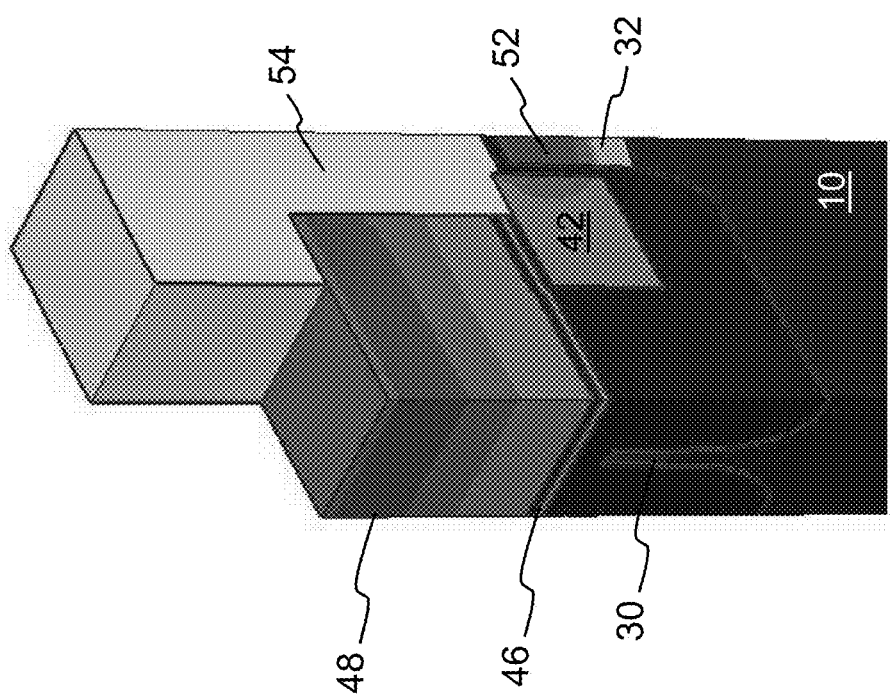

An oxide etch is used to remove spacer 50 (which served as protection for exposed portions of fin 30 during implantation of fin 32 to form source region 52). the exposed portion of insulation layer 46 is removed by isotropic etch steps (i.e., exposed areas on top of the floating gate 42 and source line 52). A masking process is used to form photoresist 54 over fin 32, over the portion of poly block 42 not underneath poly layer 48, and over a portion of poly layer 48 that is over poly block 42, as shown in FIG. 1P. Etches are then used to remove exposed portions of poly layer 48 (leaving a poly block 48a), to remove exposed portions of ONO layer 46 and to remove upper portions of oxide 44 in trenches 28/29. Photoresist 54 is then removed. The resulting structure is shown in FIG. 1Q.

Figure 1S:
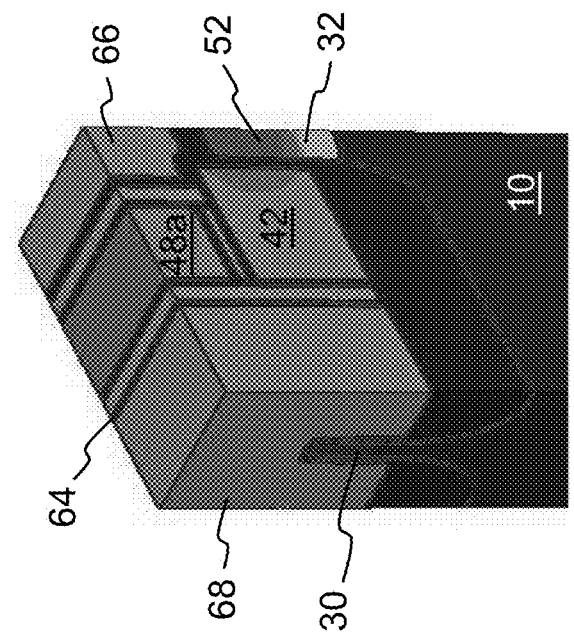
Figure 1R:
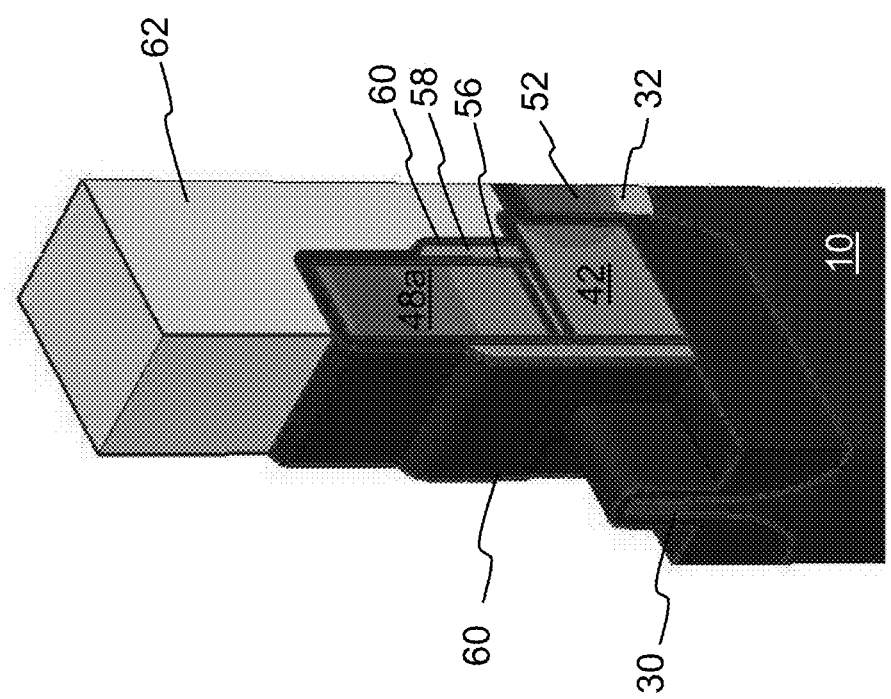

An oxide layer 56 is formed over the structure. Nitride spacers are formed along the sidewalls of poly block 48a by nitride deposition and etch. An oxide layer (tunnel oxide) 60 is formed over the structure, followed by a masking step to form photoresist 62 over fin 32 and poly block 48a, as shown in FIG. 1R. An oxide etch is used to remove the exposed oxide on the sides of the structure and fin 30. Photoresist 62 is removed. An oxide layer 64 is formed over the structure, followed by the formation of a thick layer of polysilicon. The structure is then planarized removing the upper portions of the thick layer of polysilicon and upper portion of poly block 48a, resulting in poly block 66 disposed on one side of poly block 48a (over fin 32 and source region 52) and poly block 68 disposed on the other side of poly block 48 (and wrapping around fin 30), as shown in FIG. 1S. An implantation and anneal can be performed at this time to dope poly blocks 48*a*, 66 and 68.

Figure 1U:
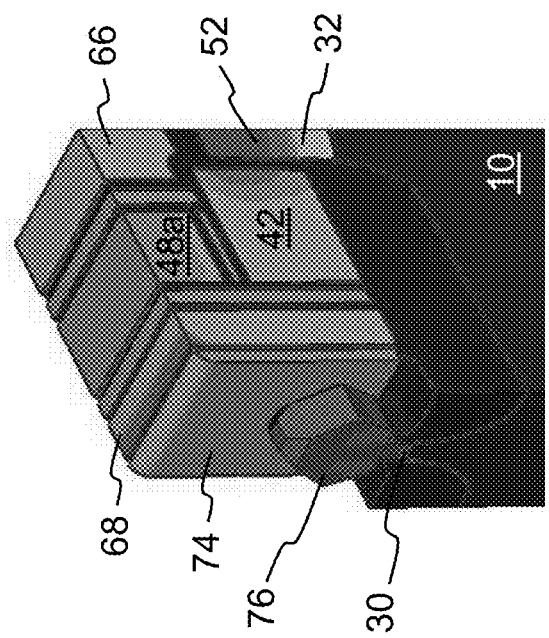
Figure 1T:
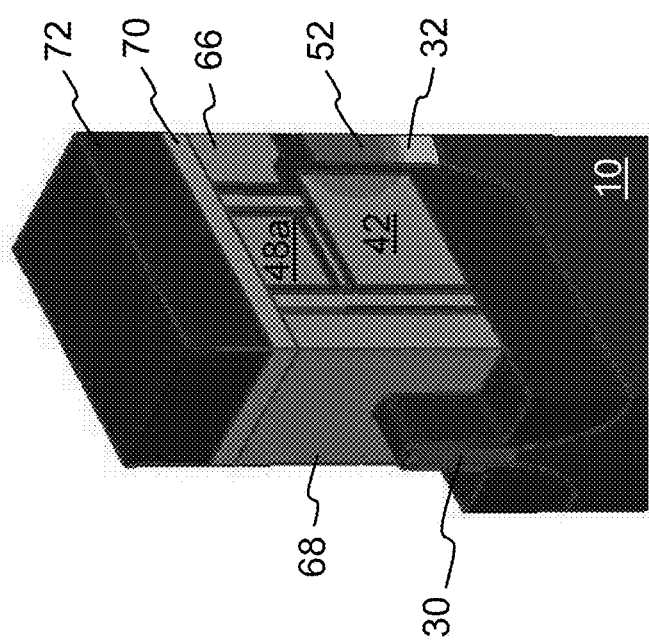

A hardmask layer 70 (e.g., amorphous carbon) is formed over the structure, and an oxide layer 72 is formed on layer 70. A masking process is then performed to cover the structure with photoresist except for a portion (but not all) of poly block 68. Etches are then used to remove the exposed portions of oxide layer 72, amorphous carbon layer 70, and poly block 68 (leaving intact the portion of poly block 68 closest to poly blocks 42 and 48*a*). An n-type drain extension implant and anneal is performed into the portion of fin 30 exposed by the etches. The resulting structure is shown in FIG. 1T (after photoresist removal). Nitride or low-K material spacer 74 is formed along the exposed sidewall of poly block 68 by deposition and etch steps. An oxide etch is used to remove oxide on, and expose, the portion of fin 30 adjacent the nitride spacer 74. The exposed portion of fin 30 is subjected to epitaxial formation of silicon carbon (SiC), anneal, and implantation, for forming an enlarged drain region 76 of fin 30. Etches are then used to remove oxide layer 72 and amorphous carbon layer 70, as shown in FIG. 1U.

Figure 1V:
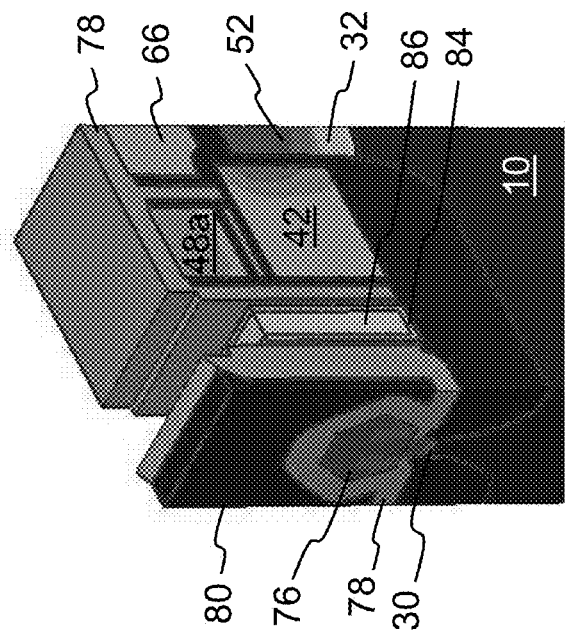
Figure 1W:
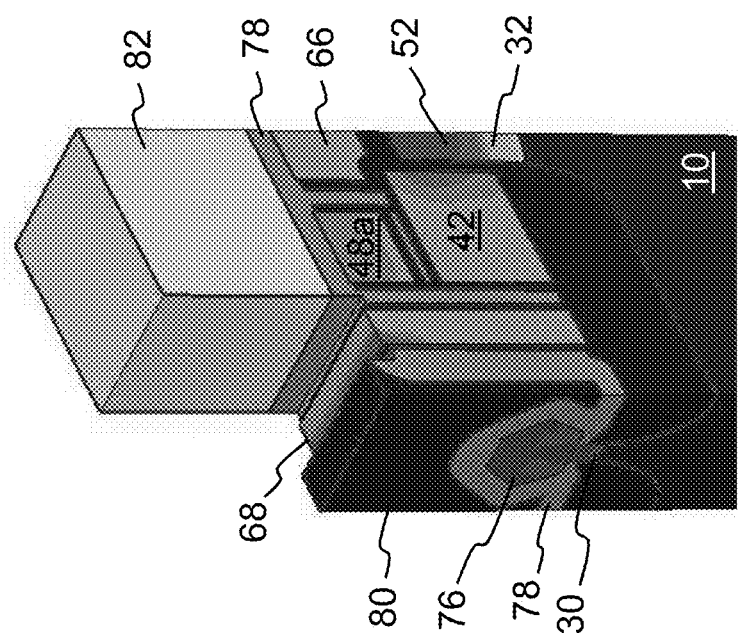
Figure 1X:
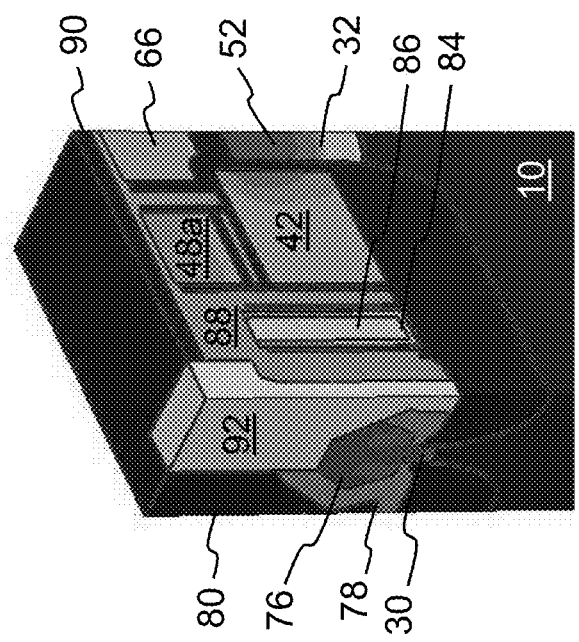

A nitride layer 78 is formed over the structure, and a layer of oxide 80 is formed on nitride layer 78. A CMP is performed to remove the portion of oxide 80 on top the flat portion of nitride layer 78 (i.e., use nitride 78 as the CMP stop, where oxide 80 remains over drain region 76). A masking step is used to form photoresist 82 on portions of nitride layer 78 over poly blocks 48*a* and 66, but not over poly block 68. A nitride etch is used to remove the exposed portion of nitride layer 78, exposing poly block 68, as shown in FIG. 1V. Photoresist 82 is removed. Then, a poly etch is used to remove poly block 68. An insulation layer 84 of a high K dielectric material (i.e. having a dielectric constant K greater than that of oxide, such as HfO2, ZrO2, TiO2, Ta2O5, or other adequate materials) is formed over the structure, followed by the deposition of a metal layer (which can include an appropriate metal gate stack). Etches are used to remove portions of the metal layer and insulation layer 84 except for a metal block 86 laterally adjacent to poly block 42 (i.e., where poly block 68 used to be before its removal). Metal block 86 is insulated on its sides and bottom by insulation layer 84, as shown in FIG. 1W.

Nitride 88 is deposited on the structure (including over metal block 86), which is followed by a CMP to planarize the top surface. Oxide 90 is then deposited over the structure. A masking step is performed to form photoresist over the structure except for over the drain region 76 of fin 30. One or more etches are then performed to form a contact hole that extends down to and exposes drain region 76. The contact hole is then filled with a conductive material (material deposition followed by CMP) to form a conductive contact 92 that is electrically connected to the drain region 76. Contact 92 can be formed of Ti, TiN, salicide and/or tungsten (e.g. by Ti deposition, TiN deposition, salicidation and anneal, W deposition, and CMP). The structure after contact formation is shown in FIG. 1X. From this point, further processing can follow CMOS baseline process flow to form multi-layer metal inter-connections for routing.

FIG. 2 is a partial perspective view of the structure of a memory cell 2 formed at the intersection of one of the fins 30 and one of the fins 32. This portion of the memory cell 2 includes spaced apart source region 52 and drain region 76 (defining a channel region 93 of the substrate extending there between along the opposing side surfaces and top surface of fin 30). The memory cell 2 further includes a word line gate 86, a floating gate 42, a control gate 48*a* and an erase gate 66. The word line gate 86 extends along and is insulated from both opposing side surfaces and the top surface of fin 30, and is disposed adjacent the drain region 76. The floating gate 42 is disposed only on only one side of the fin 30 and only one side of fin 32 (adjacent where fins 30 and 32 intersect). The control gate 48*a* is disposed over the fin 30, and over the floating gate 42. The erase gate 66 is disposed over the source region 52 (i.e., over the intersection of fins 30 and 32) and over a portion of the floating gate 42, and includes a notch 66*a* that faces an upper corner of the floating gate 42 for enhanced erase tunneling efficiency. The conductivity of one portion of the channel region 93 is controlled by the word line gate 86 wrapping around it, and the conductivity of another portion of the channel region is controlled by the floating gate 42 disposed laterally adjacent to it.

Figure 3:
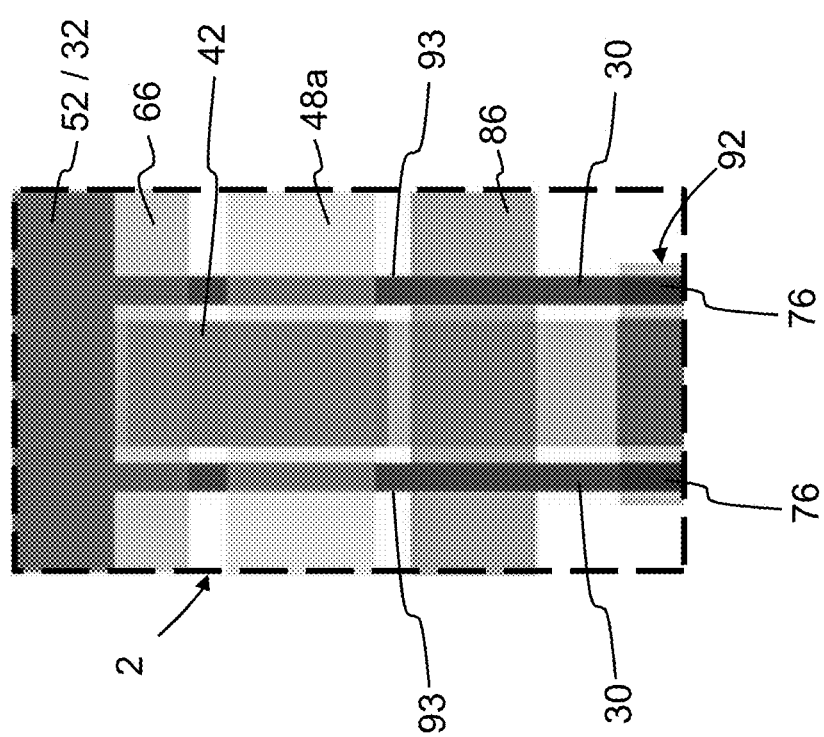
FIG. 3 is a top plan view of the split-gate non-volatile memory cell of the present invention.

FIGS. 1X and 2 show only a portion of the memory cell. Each memory cell 2 includes portions of two fins 30 that share a common floating gate 42 disposed there between. This is best shown in FIG. 3, which is a top plan view showing the memory cell 2 is formed over portions of two adjacent fins 30. The drain regions 76 of the two fins 30 are electrically connected together by contact 92. The source regions 52 for both fins 30 are electrically connected together by fin 32. The word line gate 86 extends along both side surfaces and top surface of both fins 30. Control gate 48*a* extends over both fins 30 and the floating gate 42. Each memory cell 2 includes two channel regions 93, one in each fin 30, that operate in parallel. Therefore, for example, during a read operation, the total channel region current would be the current in the channel region 93 on the left hand fin 30 of FIG. 3 added to the current in the channel region 93 on the right hand fin 30 of FIG. 3.

Figure 4:
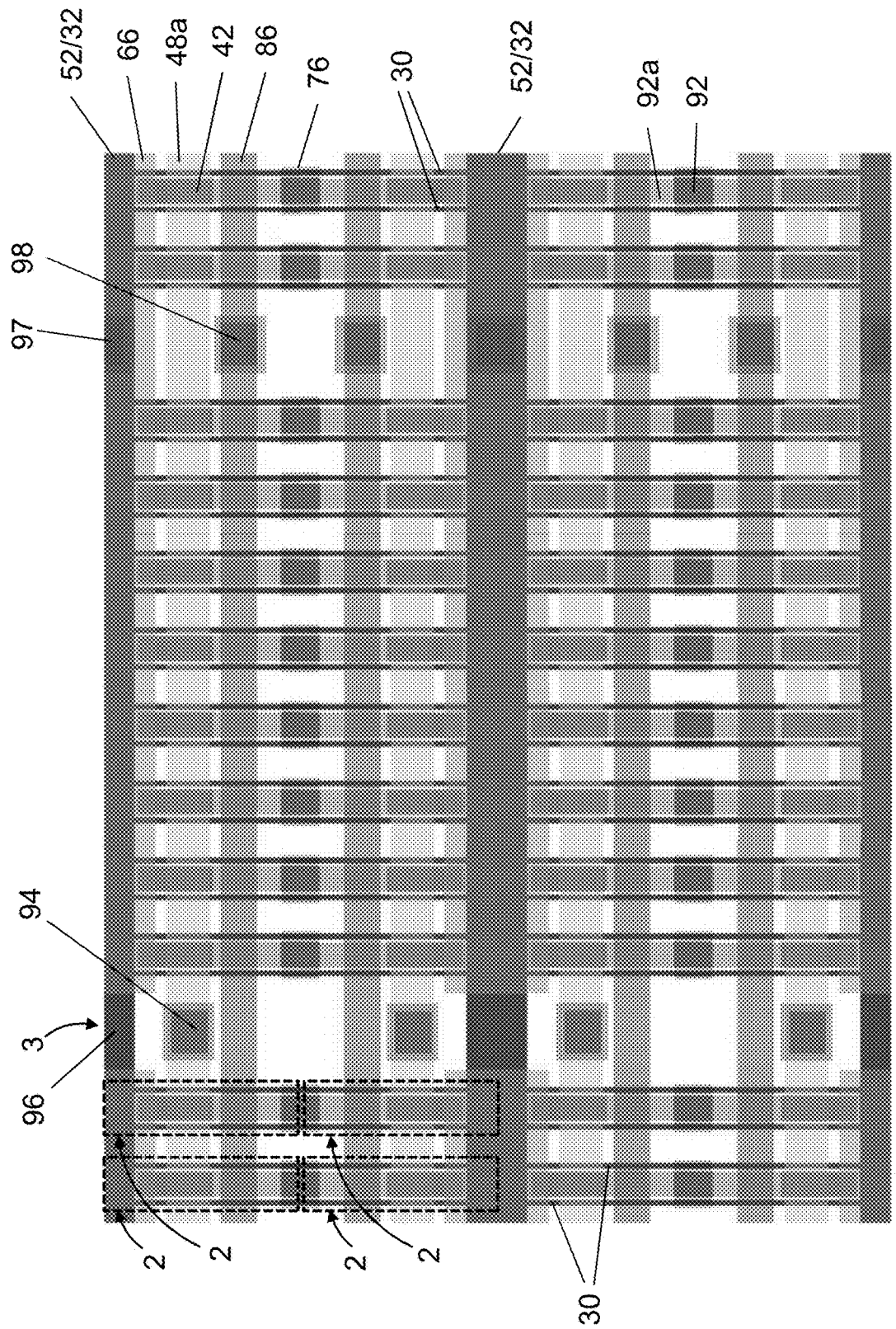
FIG. 4 is a top plan view of an array of the memory cell of the present invention.
Figure 5:
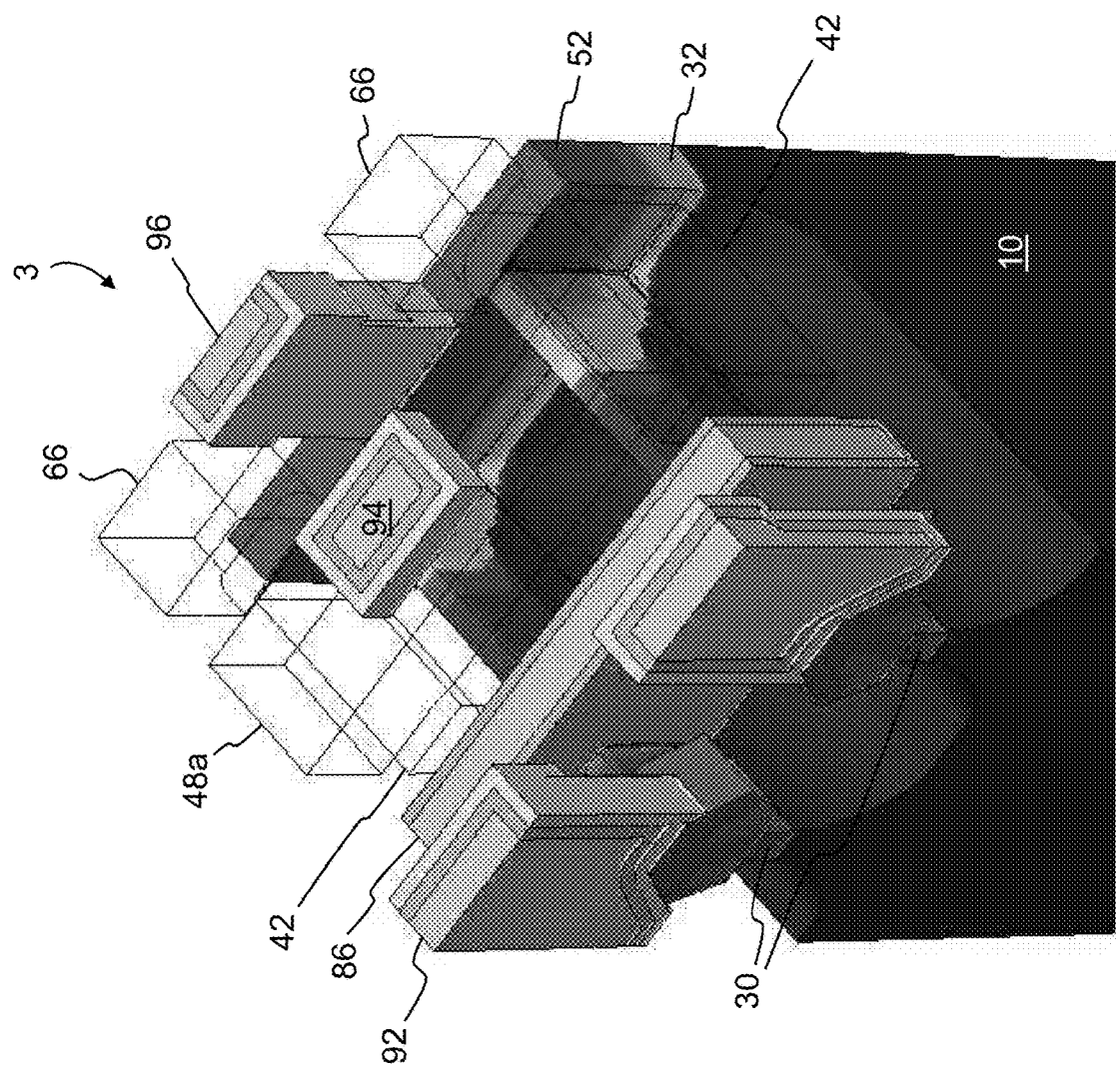
FIG. 5 is a partial perspective view of the strap cell implementing contacts to the control gate and the source line.

FIG. 4 illustrates an array of memory cells 2. Fins 30 extend in the column direction, and fins 32 extend in the row direction. Word line gates 86 are formed as a continuous line (word line) extending in the row direction and forming the word line gate 86 for a row of the memory cells 2. Similarly, control gates 48*a* are formed as a continuous line (control gate line) extending in the row direction and forming the control gates 48*a* for a row of the memory cells 2. The control gate line can include one or more control gate line contacts 94 electrically connected thereto. Fin 32 is a continuous line that constitutes at least a portion of the source region 52 for a row of the memory cells 2. Erase gates 66 are formed as discontinuous lines (erase gate lines electrically connected to some but not all of the erase gates in each row) extending in the row direction. Source line contacts 96 are formed on top of the source line regions 52 in the areas not covered by erase gates 66 (see strap cell in FIG. 5). Erase gates 66 are connected by contacts 97 formed in a similar way as control gate contacts 94. Discontinuous erase gate lines allow less than one row erase granularity (i.e., less than a full row of memory cells can be separately erased). Word line contacts 98 are formed on top of the word lines 86. The drain contacts 92 of the memory cells sharing the same column are electrically connected by a bit line 92*a* formed in first metal interconnect layer. FIG. 5 shows a perspective view of strap cell 3 implementing control gate contact 94 and source line contact 96.

The above described method of forming the memory cells, and the resulting memory array, provide many advantages including compact size, better manufacturability and better performance. These advantages are achieved from one or more of the following features. Each of the channel regions 93 for each memory cell 2 extends along the opposing side surfaces and top surface of one of the fins 30.

The word line gate 86 wraps around both fins 30, and extends along both side surfaces and top surface of each of the two fins 30 for better channel region control. The source regions 52 for a row of memory cells 2 are formed as a continuous source line in fin 32 that intersects fins 30. This allows for scaling the cells down to a smaller size, because this configuration avoids the need to form source line contacts for each pair of memory cells. Instead, the continuous source line extending along the fin 32 can be electrically connected to a strap through periodic contacts 96 (e.g., every 32 or 64 columns). By having a contact every 32 or 64 columns instead of one for every column, the size of the memory cells 2 and thus a memory array of the memory cells 2 can be significantly reduced. The erase gate 66 is disposed over the source line (i.e., over the source region 52), for further memory cell scaling.

The floating gate 42 has a box like shape positioned at the corners formed by two vertical extending fins 30 intersecting a horizontal extending fin 32, for better voltage coupling (during hot electron injection programming) to the source line in fin 32, and for better control of the channel regions 93 in fins 30 (during reading). The inventors have discovered that this configuration of the floating gate 42 relative to the intersections of fins 30 with fin 32 reduces unwanted corner rounding of the floating gate 42 during its manufacture, thus reducing unwanted variability in memory cell read and program characteristics and performance. The same oxide layer 40 can be used insulate the floating gate 42 from both fins 30 and fin 32 (i.e., this insulation has a uniform thickness between the floating gate and all three fins). The height of the memory cell is reduced by embedding at least some of the floating gate 42 inside the isolation insulation material (oxide) that insulates adjacent fins 30 from each other. Using metal and a high K dielectric to form the word line gate 86 provides better conduction and performance, and thus allows the word line gate 86 to be scaled down in size resulting in shorter channel regions 93. The inventors have further discovered that this configuration of the word line gate 86 improves the control of the sub-threshold leakage current from unselected cells sharing the same column, and improves high temperature read performance. Manufacturing is simplified by forming the erase gate 66 and the dummy poly block 68 (which is replaced with metal block 86) from the same layer of deposited polysilicon. Finally, the density of memory cells per square unit area of the substrate 10 can be significantly increased due to the extension of the channel width in the vertical direction in fins 30, and the extension of the source region 52 width in the vertical direction in fin 32.

Two separate, non-limiting sets of exemplary operating voltages for the memory cells 2 are provided in Tables 1 and 2 below.

TABLE 1

|  | Program | Erase | Read |
| --- | --- | --- | --- |
| Drain 76 | 1-2 µA | 0 V | 0.5-1.1 V |
| Word Line Gate 86 | 0.5-1.2 V | 0 V | 0.5-2.5 V |
| Control Gate 48a | 5.5-13.5 V | 0 V | 0.5-2.5 V |
| Erase Gate 66 | 3.5-5.5 V | 8.5-15.5 V | 0 V |
| Source 52 | 3.5-5.5 V | 0 V | 0 V |

TABLE 2

|  | Program | Erase | Read |
| --- | --- | --- | --- |
| Drain 76 | 1-2 µA | 0 V | 0.5-1.1 V |
| Word Line Gate 86 | 0.5-1.2 V | 0 V | 0.5-2.5 V |
| Control Gate 48a | 5.5-13.5 V | −10 V to −15 V | 0.5-2.5 V |
| Erase Gate 66 | 3.5-5.5 V | 8.5-12 V | 0 V |
| Source 52 | 3.5-5.5 V | 0 V | 0 V |

During the program operation, electrons travelling along the channel regions 93 from the drain regions 76 toward the source regions 52, become heated, and some of which will be injected onto the floating gate 42 by hot-electron injection. During the erase operation, the electrons on the floating gate 42 will tunnel through the intervening insulation to the erase gate 66 by Fowler-Nordheim tunneling. During the read operation, if the floating gate is erased of electrons, current will flow along the channel regions 93 from the source regions 52 to the drain regions 76, which is sensed as an erased state. If the floating gate is programmed with electrons, little or no current will flow along the channel regions from the source regions 52 to the drain regions 76, which will be sensed as a programmed state.

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. For example, the floating gate, control gate and/or erase gate could be formed of amorphous silicon instead of polysilicon. Further, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:
1. A memory device, comprising:
   a semiconductor substrate having an upper surface with a plurality of upwardly extending fins, wherein each of the fins including first and second side surfaces that oppose each other and that terminate in a top surface;
a first fin of the plurality of fins has a length that extends in a first direction;
a second fin of the plurality of fins has a length that extends in the first direction;
a third fin of the plurality of fins has a length that extends in a second direction that is perpendicular to the first direction;
a memory cell, comprising:
  spaced apart first source and first drain regions in the first fin, with a first channel region of the first fin extending along the top surface and the opposing side surfaces of the first fin between the first source and first drain regions, wherein the first source region is disposed at an intersection of the first and third fins,
  spaced apart second source and second drain regions in the second fin, with a second channel region of the second fin extending along the top surface and the opposing side surfaces of the second fin between the second source and second drain regions, wherein the second source region is disposed at an intersection of the second and third fins,
  a floating gate disposed laterally between and insulated from the first and second fins, and is disposed laterally adjacent to and insulated from the third fin, wherein the floating gate extends along and is insulated from a first portion of the first channel region and a first portion of the second channel region,
  a word line gate that extends along and is insulated from a second portion of the first channel region and a second portion of the second channel region,
  a control gate that is disposed over and insulated from the floating gate, and
  an erase gate that includes a first portion disposed over and insulated from the first and second source regions and a second portion that is disposed over and insulated from the floating gate.

2. The memory device of claim 1, wherein the word line gate extends along and is insulated from the first and second side surfaces and the top surface of the first fin and extends along and is insulated from the first and second side surfaces and the top surface of the second fin.

3. The memory device of claim 1, further comprising:
a conductive contact electrically connected to the first and second drain regions.

4. The memory device of claim 1, wherein the floating gate is insulated from the second side surface of the first fin by first insulation having a first thickness, is insulated from the first side surface of the second fin by second insulation having a second thickness, and is insulated from the first side surface of the third fin by third insulation having a third thickness, wherein the first, second and third thicknesses are equal to each other.

5. The memory device of claim 1, wherein the erase gate includes a notch facing an upper edge of the floating gate.

6. The memory device of claim 1, wherein the word line gate is formed of a metal material and is insulated from the first and second channel regions by a high K dielectric material.

7. A memory device, comprising:
a semiconductor substrate having an upper surface with a plurality of upwardly extending fins, wherein each of the fins including first and second side surfaces that oppose each other and that terminate in a top surface;
first fins of the plurality of fins each has a length that extends in a column direction;
second fins of the plurality of fins each has a length that extends in a row direction that is perpendicular to the column direction;
a plurality of memory cells arranged in rows and columns on the substrate, each of the memory cells comprises:
  spaced apart first source and first drain regions in one of the first fins, with a first channel region of the one first fin extending along the top surface and the opposing side surfaces of the one first fin between the first source and first drain regions, wherein the first source region is disposed at an intersection of the one first fin and one of the second fins,
  spaced apart second source and second drain regions in another one of the first fins, with a second channel region of the another one first fin extending along the top surface and the opposing side surfaces of the another one first fin between the second source and second drain regions, wherein the second source region is disposed at an intersection of the another one first fin and the one second fin,
  a floating gate disposed laterally between and insulated from the one first fin and the another one first fin, and is disposed laterally adjacent to and insulated from the one second fin, wherein the floating gate extends along and is insulated from a first portion of the first channel region and a first portion of the second channel region,
  a word line gate that extends along and is insulated from a second portion of the first channel region and a second portion of the second channel region,
  a control gate that is disposed over and insulated from the floating gate, and
  an erase gate that includes a first portion disposed over and insulated from the first and second source regions and a second portion that is disposed over and insulated from the floating gate.

8. The memory device of claim 7, wherein for each of the memory cells, the word line gate extends along and is insulated from the first and second side surfaces and the top surface of the one first fin and extends along and is insulated from the first and second side surfaces and the top surface of the another one first fin.

9. The memory device of claim 7, wherein each memory cell further comprises:
a conductive contact electrically connected to the first and second drain regions.

10. The memory device of claim 7, wherein for each of the memory cells, the floating gate is insulated from the second side surface of the one first fin by first insulation having a first thickness, is insulated from the first side surface of the another one fin by second insulation having a second thickness, and is insulated from the first side surface of the one second fin by third insulation having a third thickness, wherein the first, second and third thicknesses are equal to each other.

11. The memory device of claim 7, wherein for each of the memory cells, the erase gate includes a notch facing an upper edge of the floating gate.

12. The memory device of claim 7, wherein for each of the memory cells, the word line gate is formed of a metal material and is insulated from the first and second channel regions by a high K dielectric material.

13. The memory device of claim 7, further comprising:
a plurality of word lines each electrically connected to the word line gates of a row of the memory cells;

a plurality of control gate lines each electrically connected to the control gates of a row of the memory cells; and
a plurality of erase gate lines each electrically connected to some but not all of the erase gates of a row of the memory cells.

* * * * *